United States Patent Office 3,543,165
Patented Nov. 24, 1970

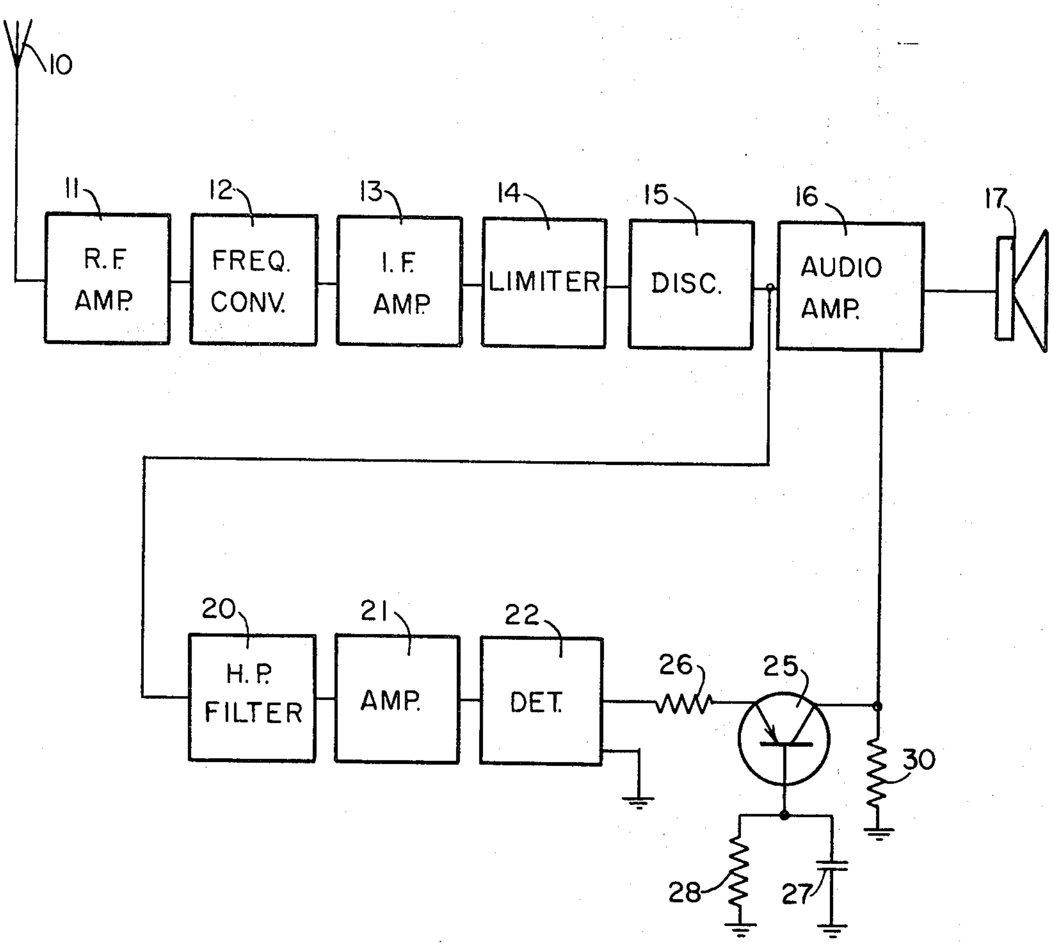
Inventor
STANLEY J. TOMSA
BY
Mueller, Aichele & Rauner
ATTYS.

3,543,165

TRANSISTOR SWITCH CIRCUIT RESPONSIVE TO CHANGE IN DIRECT CURRENT VOLTAGE

Stanley J. Tomsa, Berwyn, Ill., assignor to Motorola, Inc., Franklin Park, Ill., a corporation of Illinois Filed Oct. 2, 1967, Ser. No. 672,227
Int. Cl. H04b *1/10*
U.S. Cl. 325—348 5 Claims

ABSTRACT OF THE DISCLOSURE

Transistor switch circuit wherein a transistor is saturated by the input to form low pass filter and the transistor is cut off in response to a rapid change in the applied voltage. A capacitor and resistor are connected in parallel between the base of the transistor and ground and the input signal is direct current coupled to the emitter so that the capacitor charges to a voltage proportional to the average of the applied voltage, and this appears at the collector as the output. The transistor is reverse biased by an input signal which changes faster than the condenser voltage can change to cut off the output. The circuit provides filtering of the output voltage without sacrificing response time.

BACKGROUND OF THE INVENTION

There are many applications in which it is desired to provide a first response to a varying DC signal, and a different response to a rapid change in the voltage of the signal. One such application is in a squelch circuit for a frequency modulation receiver wherein the noise signal above the audio band can be selected and detected to control the audio output of the receiver. When a carrier is received and it is desired to reproduce the frequency modulation thereon, the noise will drop and this action is used to unsquelch (render operative)) the audio amplifier. However, circuits for providing such a response have usually required a number of components so that considerable cost is involved. The detected noise voltage must be filtered to remove ripple to make it usable to turn an audio amplifier on or off. This has the disadvantage that it slows the response time and produces a "squelch tail." Also, such circuits have been sensitive to changes in the operating voltage which may vary through a wide range in the case of receivers used in vehicles.

There are other applications in which it is desired to monitor the average value of a varying voltage and the instantaneous value thereof, and to provide a response when the instantaneous value departs radically from the average value.

SUMMARY OF THE INVENTION

It is an object of the present invention to provide a simple semiconductor circuit which provides an output representing the average value of an input signal which includes a ripple component, and which provides a fast change in the output voltage if the input voltage changes sharply from its average value.

Another object is to provide a circuit which responds to a change in voltage of a signal and which provides filtering to remove ripple from the output voltage without sacrificing response time.

In accordance with the invention a level following switch includes a transistor having its base electrode connected to a reference potential by a parallel circuit including a capacitor and a resistor, with an input signal direct current coupled to the emitter electrode. A resistor is connected between the collector and ground and forms the output of the circuit. The level following switch can be used in a squelch circuit for an FM receiver wherein noise is selected and applied to an envelope detector which is direct current coupled to the level following switch. The transistor conducts so that the circuit forms a low pass filter to remove the ripple from the applied signal and produce an output corresponding to the average input signal. A sharp change in the input signal from the average value acts to cut off the transistor so that the output voltage falls to zero, and this can be used to provide squelch action.

The system is illustrated in the single figure of the drawing wherein the circuit of the level following switch is shown connected to a receiver, shown in block diagram.

Referring now to the drawing, input signals which may be frequency modulated are picked up by antenna 10 and selected and amplified in radio frequency circuit 11. The received carrier wave is reduced in frequency by frequency converter 12 which may include one or more stages of frequency conversion. The intermediate frequency output from the converter 12 is amplified in intermediate frequency amplifier 13 and amplitude variations in the signal are removed by limiter 14. The frequency modulation is derived by discriminator 15 and applied to audio amplifier 16. The audio signal is reproduced by loudspeaker 17.

The output of discriminator 15 includes, in addition to the audio signal, noise picked up by the antenna as well as noise generated in the amplifiers and other stages of the receiver. Signals above the audio frequency and harmonics thereof are selected by high pass filter 20. This may pass signals above 8,000 to 10,000 cycles and the output may include signals up to 20,000 cycles. The noise signals selected by the filter 20 are amplified in amplifier 21 and detected by envelope detector 22.

The level following switch includes a PNP transistor 25. The envelope signal is applied from detector 22 through resistor 26 to the emitter of transistor 25. The resistor 26 provides direct current coupling of the detector output to the switch. The base of the transistor 25 is connected to ground through capacitor 27 and resistor 28 connected in parallel. Resistor 30 forms the load and is connected from the collector of transistor 25 to ground. The signal developed across resistor 30 is applied to the audio amplifier 16 to control the conductivity thereof, or to provide squelch action as it is commonly called.

The direct current voltage applied through resistor 26 to the emitter of transistor 25 saturates the transistor causing capacitor 27 to charge. When transistor 25 is saturated the circuit functions as a low pass filter with the high frequencies (ripple components) being shorted to ground through capacitor 27. The voltage developed across capacitor 27 is applied through the base-collector junction to resistor 30, so that the output voltage across resistor 30 represents the average voltage of the applied signal. The filter removes the ripple from this voltage so that it can be utilized as a control voltage to cut off the audio amplifier 16. In the event that the input voltage drops suddenly, the emitter potential will fall below the base potential so that the transistor 25 will be rendered nonconducting. In such case the collector will become open circuited so that the voltage across resistor 30 drops to zero. The control voltage applied to the audio amplifier 16 is therefore terminated so that the audio amplifier can conduct.

In an FM receiver as shown, when a received carrier transmission is terminated the noise voltage will rise suddenly. The detector 22 may be of a type such that the output voltage drops with the increased noise, and this output is applied through resistor 26 to the emitter of transistor 25. The transistor 25 is therefore cut off and the voltage across resistor 30 drops to zero to initiate the squelch action. This action takes place very fast and does not involve the delay resulting from the response time of a separate filter, so that the "squelch tail" which may result from a delay is eliminated. When the carrier resumes and the noise decreases, the detected voltage will be applied through resistor 26 to the emitter of transistor 25 to again saturate transistor 25 to provide the filter action previously described which causes a voltage to be developed across resistor 30.

If carrier transmission is not resumed, the switch will find a new steady state saturated mode about the new noise level and again provide filtering. This will happen after the resistor-capacitor combination connected to the base electrode has charged (or discharged) to a new value. The transistor is cut off only during the transient case when there is a rapid input voltage change.

What is claimed is:

1. A circuit which responds to a direct current control signal having a ripple component to produce a direct current output voltage the amplitude of which corresponds to the average amplitude of the control signal and wherein the amplitude of the output voltage changes in response to a sudden change in the amplitude of the control signal, such circuit including in combination, means supplying the control signal having a ripple component, a semiconductor device having common, input and output electrodes, said input electrodes being connected to said means so that said control signal is applied thereto, a point of reference potential, a capacitor and resistor connected in parallel with each other between said common electrode and said point of reference potential, said capacitor providing a bias potential to said semiconductor device which bias is derived from the control signal, and load means connected between said output electrode and said point of reference potential, said semiconductor device being rendered conductive in response to the control signal applied to said input electrode to cooperate with said capacitor to form a filter, said filter deriving a voltage having an amplitude corresponding to the average amplitude of said control signal and applying the same to said load means, said semiconductor device being cut off in response to a rapid change in the control signal to interrupt the coupling of said voltage from said filter to said load means.

2. A circuit in accordance with claim 1 wherein said semiconductor device is a transistor having base, emitter and collector electrodes, with said base electrode forming the common electrode, said emitter electrode forming the input electrode and said collector electrode forming the output electrode.

3. A circuit in accordance with claim 1 wherein said transistor is of the PNP type and is cut off in response to a drop in the control signal.

4. A circuit in accordance with claim 1 wherein said transistor is of the NPN type and is cut off in response to a rise in the control signal.

5. A squelch circuit adapted for use in a frequency modulation receiver having an audio amplifier for reproducing the demodulated signal which amplifier is adapted to be rendered operative and inoperative in response to a direct current squelch voltage, and the frequency modulation receiver also having a first circuit means for producing a direct current control signal which varies with the noise in the receiver and which control signal has a ripple component, the squelch circuit including in combination, a transistor having base, emitter and collector electrodes, a point of reference potential, a capacitor and resistor connected in parallel with each other between said base electrode and said point of reference potential, direct current coupling means applying the control signal having a ripple component from the first circuit means to said emitter electrode, and output means connecting said collector electrode to the audio amplifier, said capacitor providing a bias potential to said base electrode which is derived from said control signal, said transistor being rendered conductive in response to the control signal applied to said emitter electrode to cooperate with said capacitor to form a filter, said capacitor charging to the average amplitude of said control signal and applying the same through the base-collector junction of said transistor to said output means thereby providing the direct current squelch voltage, and said transistor being cut off in response to a rapid change in said control signal so that the squelch voltage at said output means is rapidly interrupted to render the audio amplifier inoperative.

References Cited

UNITED STATES PATENTS

| | | | |
|---|---|---|---|
| 3,195,052 | 7/1965 | Cohn et al. | 325—478 |
| 3,199,031 | 8/1965 | Harris et al. | 325—478 X |
| 3,292,085 | 12/1966 | Black | 325—478 X |

RICHARD MURRAY, Primary Examiner

B. V. SAFOUREK, Assistant Examiner

U.S. Cl. X.R.

307—246; 325—319, 478